(12) United States Patent
Martinschitz et al.

(10) Patent No.: US 10,163,681 B2
(45) Date of Patent: Dec. 25, 2018

(54) METHOD FOR PERMANENTLY BONDING WAFERS BY A CONNECTING LAYER BY MEANS OF SOLID STATE DIFFUSION OR PHASE TRANSFORMATION

(75) Inventors: Klaus Martinschitz, St. Florian am Inn (AT); Markus Wimplinger, Ried im Innkreis (AT); Bernhard Rebhan, Haag a. H. (AT); Kurt Hingerl, Wolfern (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 14/232,911

(22) PCT Filed: Aug. 30, 2011

(86) PCT No.: PCT/EP2011/064874
§ 371 (c)(1),
(2), (4) Date: Jan. 15, 2014

(87) PCT Pub. No.: WO2013/029656
PCT Pub. Date: Mar. 7, 2013

(65) Prior Publication Data
US 2014/0154867 A1      Jun. 5, 2014

(51) Int. Cl.
*H01L 21/762* (2006.01)
*H01L 23/00* (2006.01)
(Continued)

(52) U.S. Cl.
CPC ...... *H01L 21/76251* (2013.01); *B23K 35/001* (2013.01); *B23K 35/0255* (2013.01);
(Continued)

(58) Field of Classification Search
CPC . H01L 21/76251; H01L 21/185; H01L 24/94; H01L 24/32; H01L 24/05;
(Continued)

(56) References Cited

U.S. PATENT DOCUMENTS 3,923,231 A * 12/1975 Catalano ............ B23K 35/007
                                                    228/193
4,077,558 A *  3/1978 Carlson ................ B23K 1/19
                                                    228/121
(Continued)

FOREIGN PATENT DOCUMENTS

CN          1198114 A      11/1998    ............ B22F 3/24
CN          1564726 A       1/2005    ............ B22F 1/00
(Continued)

OTHER PUBLICATIONS

Zhang et al., "Surface Planarization of Cu/Sn Micro-bump and its Application in Fine Pitch Cu/Sn Solid State Diffusion Bonding," $12^{th}$ Electronics Packaging Technology Conference, Singapore, Dec. 2010, IEEE, Institute of Electrical and Electronics Engineers, pp. 143-146.

(Continued)

*Primary Examiner* — Moazzam Hossain
*Assistant Examiner* — Stanetta Isaac
(74) *Attorney, Agent, or Firm* — Kusner & Jaffe (57) ABSTRACT

A method for bonding of a first solid substrate to a second solid substrate which contains a first material with the following steps, especially the following sequence: formation or application of a function layer which contains a second material to the second solid substrate, making contact of the first solid substrate with the second solid substrate on the function layer, pressing together the solid substrates for forming a permanent bond between the first and second solid substrate, at least partially reinforced by solid diffusion and/or phase transformation of the first material with the second material, an increase of volume on the function layer being caused.

26 Claims, 5 Drawing Sheets

(51) Int. Cl.
H01L 25/065 (2006.01)
H01L 25/00 (2006.01)
H01L 21/18 (2006.01)
B23K 35/00 (2006.01)
B23K 35/26 (2006.01)
B23K 35/30 (2006.01)
B23K 35/02 (2006.01)
B23K 20/02 (2006.01)
B23K 101/40 (2006.01)

(52) U.S. Cl.
CPC .......... *B23K 35/262* (2013.01); *B23K 35/302* (2013.01); *H01L 21/185* (2013.01); *H01L 24/05* (2013.01); *H01L 24/08* (2013.01); *H01L 24/27* (2013.01); *H01L 24/29* (2013.01); *H01L 24/32* (2013.01); *H01L 24/83* (2013.01); *H01L 24/94* (2013.01); *H01L 25/0657* (2013.01); *H01L 25/50* (2013.01); *B23K 20/021* (2013.01); *B23K 20/023* (2013.01); *B23K 2101/40* (2018.08); *H01L 2224/038* (2013.01); *H01L 2224/0384* (2013.01); *H01L 2224/04026* (2013.01); *H01L 2224/05557* (2013.01); *H01L 2224/05647* (2013.01); *H01L 2224/0801* (2013.01); *H01L 2224/08501* (2013.01); *H01L 2224/275* (2013.01); *H01L 2224/278* (2013.01); *H01L 2224/2745* (2013.01); *H01L 2224/2784* (2013.01); *H01L 2224/27452* (2013.01); *H01L 2224/27505* (2013.01); *H01L 2224/2908* (2013.01); *H01L 2224/29019* (2013.01); *H01L 2224/29111* (2013.01); *H01L 2224/29124* (2013.01); *H01L 2224/29144* (2013.01); *H01L 2224/29147* (2013.01); *H01L 2224/29166* (2013.01); *H01L 2224/29181* (2013.01); *H01L 2224/29184* (2013.01); *H01L 2224/29211* (2013.01); *H01L 2224/29311* (2013.01); *H01L 2224/29347* (2013.01); *H01L 2224/3201* (2013.01); *H01L 2224/325* (2013.01); *H01L 2224/32501* (2013.01); *H01L 2224/7565* (2013.01); *H01L 2224/838* (2013.01); *H01L 2224/83013* (2013.01); *H01L 2224/83022* (2013.01); *H01L 2224/8383* (2013.01); *H01L 2224/8384* (2013.01); *H01L 2224/83191* (2013.01); *H01L 2224/83193* (2013.01); *H01L 2224/83203* (2013.01); *H01L 2224/83345* (2013.01); *H01L 2224/83365* (2013.01); *H01L 2224/83385* (2013.01); *H01L 2224/94* (2013.01); *H01L 2924/01029* (2013.01); *H01L 2924/01327* (2013.01); *H01L 2924/1434* (2013.01); *H01L 2924/351* (2013.01); *H01L 2924/3511* (2013.01)

(58) Field of Classification Search
CPC .......... H01L 24/83; H01L 2224/80894; H01L 2224/80901; H01L 2224/82895; H01L 2224/8583; H01L 2224/85895; H01L 2224/85897; H01L 2224/83895; B23K 35/0255; B23K 35/262; B23K 35/302; B23K 20/023; B23K 20/233; B23K 20/021; B23K 20/02; B23K 35/001
See application file for complete search history.

(56) References Cited

U.S. PATENT DOCUMENTS

| | | | |
|---|---|---|---|
| 5,276,955 A | 1/1994 | Noddin et al. | 29/593 |
| 5,372,298 A * | 12/1994 | Glaeser | B23K 20/023 228/121 |
| 5,897,341 A * | 4/1999 | Love | H01L 24/81 257/E21.511 |
| 6,015,775 A * | 1/2000 | Takayama | B22F 3/24 419/8 |
| 8,936,998 B2 | 1/2015 | Utsumi et al. | H01L 21/2007 |
| 2002/0028538 A1* | 3/2002 | Parfeniuk | C23C 14/3407 438/118 |
| 2002/0090756 A1 | 7/2002 | Tago et al. | 438/108 |
| 2002/0121706 A1* | 9/2002 | Tatsuta | H01L 21/563 257/778 |
| 2003/0186476 A1* | 10/2003 | Naydenkov | G02B 6/12007 438/26 |
| 2004/0245648 A1* | 12/2004 | Nagasawa | B22F 1/0022 257/772 |
| 2006/0057421 A1* | 3/2006 | Maria et al. | 428/688 |
| 2006/0093840 A1* | 5/2006 | Christoph et al. | 428/469 |
| 2006/0234473 A1 | 10/2006 | Wong et al. | 438/455 |
| 2008/0041517 A1 | 2/2008 | Moriceau et al. | 156/182 |
| 2008/0237314 A1 | 10/2008 | Yu et al. | 228/245 |
| 2010/0084765 A1 | 4/2010 | Lee et al. | 257/738 |
| 2010/0276723 A1* | 11/2010 | Utsumi et al. | 257/99 |
| 2013/0213561 A1 | 8/2013 | Utsumi et al. | H01L 21/2007 |
| 2013/0299080 A1* | 11/2013 | Plach | H01L 21/187 156/272.6 |

FOREIGN PATENT DOCUMENTS

| | | | |
|---|---|---|---|
| CN | 101849276 A | 9/2010 | ............ B23K 20/00 |
| JP | 7-506773 | 7/1995 | ............ B23K 20/00 |
| JP | 2002-110726 | 4/2002 | ............ H01L 21/60 |
| JP | 2004-337927 | 12/2004 | ............ B23K 20/00 |
| JP | 2005-032834 A | 2/2005 | ............ H01L 21/60 |
| JP | 2005-104810 | 4/2005 | ............ C04B 37/02 |
| JP | 2010-046696 | 3/2010 | ............ B23K 20/00 |
| WO | WO 93/21750 | 10/1993 | ............ H05K 3/36 |
| WO | WO 94/17551 | 8/1994 | ............ H01L 21/60 |
| WO | WO 97/05980 | 2/1997 | ............ B22F 7/02 |
| WO | WO 2009/122867 | 10/2009 | ............ H01L 21/60 |

OTHER PUBLICATIONS

Zhang et al., "Fine Pitch Micro-bump Interconnections for Advanced 3D Chip Stacking," ECS Transactions, The Electrochemical Society, vol. 34, No. 1, Mar. 2011, pp. 523-528.
Zhang et al., "Fine Pitch Cu/Sn Solid State Diffusion Bonding for Making High Yield Bump Interconnections and its Application in 3D Integration," Electronic System-Integration Technology Conference, Sep. 2010, IEEE, pp. 1-4.
Maeda et al., "Early Stage of Solid State Interfacial Reaction between Copper and Tin," Defect and Diffusion Forum, vols. 283-286, Mar. 2009, pp. 323-328.
Predel, "Cu—Sn (Copper-Tin)," "Numerical Data and Functional Relationships in Science and Technology," Landolt-Börnstein—Group IV Physical Chemistry, vol. 5d, Phase Equilibria, Crystallographic and Thermodynamic Data of Binary Alloys, 1994, pp. 257-261.
Kumar et al., "Plastic deformation processes in Cu/Sn bimetallic films," Journal of Materials Research, vol. 23, No. 11, Nov. 2008, pp. 2916-2934.
Kumar et al., "Intrinsic and Interdiffusion in Cu—Sn System," Journal of Phase Equilibria and Diffusion, vol. 32, No. 4, May 2011, pp. 309-319.
Laurila et al., "Interfacial reactions between lead-free solders and common base materials," Materials Science and Engineering R, Reports: A Review Journal, vol. 49, Nos. 1-2, Mar. 2005, pp. 1-60.
International Search Report for International Application No. PCT/EP2011/064874, dated Sep. 24, 2012.
Office Action (dated Mar. 4, 2015) issued in connection with corresponding Japanese Patent Application 2014-527503.
Office Action (dated Oct. 13, 2015) issued in connection with corresponding European Patent Application 11 749 832.9-1552.
Website printout from Wikipedia, the free encyclopedia "Mohs scale of mineral hardness" en.wikipedia.org/w/index.php?tutke=Mohs_scale_of_mineral_hardess&oldid=444930318, revision date Aug. 15, 2011.

(56) References Cited

OTHER PUBLICATIONS

Office Action issued in corresponding European Patent Application No. 15201506.1-1552 dated Jun. 1, 2016.
Predel,"23 Cu-X binary systems," Landolt Börnstein New Series IV/5d, pp. 257-261.
"Molar Volume," website printout from https://web.archive.org/web/20101228050852/http://www.knowledgedoor.com/2/elements_handbook/molar_volume.html.
Banerjee, "Phase Transformations: Titanium and Zirconium Alloys," Elsevier B.V., pp. 584-587.
Zhang, et al., "Fine pitch Cu/Sn solid state diffusion bonding for making high yield bump interconnections and its application in 3D integration," IMEC.
Bozzolo, et al., "Lattice parameters of fcc binary alloys using a new semiempirical method," Scripta Metallurgica et Materialia, vol. 26, pp. 1275-1280, 1992.
Paul, et al., "An internal convective heating technique for diffusion bonding arrayed microchannel architectures," Precision Engineering, vol. 34, pp. 554-562, 2010.
"Mohs scale of mineral hardness," website printout from https://en.wikipedia.org/w/index.php?title=Mohs_scale_of_mineral_hardness&oldid=444930318, 2011.
Office Action issued in corresponding Chinese Patent Application No. 201180071145.5 dated Aug. 11, 2016.
Jin Soo Lee, et al., "Chip to Chip Bonding using micro-Cu Bumps with Sn Capping Layers," Hynix Semiconductor, Inc., S. Korea and Division of Materials Science & Engineering, Hanyang University, Seoul, Korea.
D. Q. Yu, et al., "Newly Developed Low Cost, Reliable Wafer Level Hermetic Sealing Using Cu/Sn System," Institute of Microelectronics, CAS, P. R. China and Institute of Microelectronics, A *STAR, Singapore.
Rahul Agarwal, et al., "High Density Cu—Sn TLP Bonding for 3D Integration," IMEC vzw, 2009 Electronic Components and Technology Conference.
Bosco et al., "Critical interlayer thickness for transient liquid phase bonding in the Cu—Sn System," Materials Department, University of California, Santa Barabara, California, 2004.
Aasmundtveit et al., "Au—Sn SLID Bonding: Fluxless Bonding with High Temperature Stability, to Above 350° C.," Vestfold University College, Tonsberg, Norway, SINTEF Materials and Chemistry, Oslo, Norway, SensoNor Technologies, Horten, Norway.
Greitmann et al., "AuSn Thin Film Solder Layers for Assembly of Optoelectronic Devices," 14th European Microelectronics and Packaging Conference & Exhibition, Friedrichshafen, Germany, Jun. 23-25, 2003, 5 pages.
Article entitled: "Gold-Tin: The Unique Eutectic Solder Allow," Application Note, Indium Corporation, 2015, 2 pages.
W. Zhang et al., "Surface Planarization of Cu/Sn Micro-bump and its Application in Fine Pitch Cu/Sn Solid State Diffusion Bonding," 2010 12$^{th}$ Electronics Packaging Technology Conference, pp. 143-146, 2010.
State Intellectual Property Office of People's Republic China Search Report issued in corresponding Chinese Patent Application No. 201180071145.5.
Office Action issued in corresponding Chinese Patent Application No. 201180071145.5 dated Feb. 14, 2016 (with English translation).

\* cited by examiner

METHOD FOR PERMANENTLY BONDING WAFERS BY A CONNECTING LAYER BY MEANS OF SOLID STATE DIFFUSION OR PHASE TRANSFORMATION

FIELD OF THE INVENTION

This invention relates to a method for bonding of a first solid substrate which contains a first material, especially semiconductor wafers, to a second solid substrate, especially semiconductor wafers.

BACKGROUND OF THE INVENTION

The objective in permanent or irreversible bonding of solid substrates is to produce a connection as strong and especially as permanent as possible, therefore a high bond force, between the two contact surfaces of the solid substrates. For this purpose, in the prior art there are various approaches and production methods, especially the welding of the surfaces at higher temperatures.

All types of materials, predominantly however metals and ceramics, are permanently bonded. One of the most important systems of permanent bonding is metal-metal systems. Cu—Cu systems have appeared increasingly in recent years. The development of 3D structures specifically requires mostly the joining of different functional layers. This joining is more and more often done by way of so-called TSVs (Through Silicon Vias). The contact-making of these TSVs with one another very often takes place by copper contact sites. At the instant of bonding very often there are full-value, serviceable structures, for example microchips, on one or more surfaces of the solid substrates. Since different materials with different coefficients of thermal expansion are used in microchips, increasing the temperature during bonding is not desirable. This can lead to thermal expansions and thus thermal stresses which can destroy parts of the microchip or its vicinity.

The known production methods and the approaches which have been followed to date often lead to results which cannot be reproduced or can be poorly reproduced and which can hardly be applied especially to altered conditions. In particular, production methods which are used at present often use high temperatures, especially >400° C., in order to ensure reproducible results.

Technical problems such as high energy consumption and a possible destruction of structures which are present on the substrates result from the high temperatures of in part far above 300° C. which have been necessary to date for a high bond force.

Other demands consist of the following:
(1) Front-end-of-line compatibility.
This is defined as the compatibility of the process during the production of the electrically active components. The bonding process must therefore be designed such that active components such as transistors, which are already present on the structure wafers, are neither adversely affected nor damaged during the processing. Compatibility criteria include mainly the purity of certain chemical elements (mainly in CMOS structures) and mechanical loadability, mainly by thermal stresses.
(2) Low contamination.
(3) No application of force, or application of force as low as possible.
(4) Temperature as low as possible, especially for materials with different coefficients of thermal expansion.

The reduction of the bond force leads to more careful treatment of the structure wafer and thus to a reduction of the failure probability by direct mechanical loading, especially when the insulating layers between the metallic conductors are made from so-called "low-k" materials.

The welding of two surfaces works better, the flatter the surfaces, the less contamination on the surfaces, and the more perfect their surface structure. In reality it has to do with surfaces which are contaminated by water, organic substances, particles or the like which have a not negligible surface roughness and are very often more or less highly oxidized. The particles are removed in industry by various processes, generally in several modules which are independent of one another. The removal of oxides is certainly one of the most difficult challenges, since metal oxides are chemically rather stable. Even if all adhesive substances and chemically produced products are removed from the metal surface, there is still the rough surface as the last barrier to a perfect bond.

Current bonding methods are designed primarily for high pressures and temperatures. Mainly avoiding a high temperature is of essential importance for the welding of future semiconductor applications, since different materials with different coefficients of thermal expansion generate thermal stresses which cannot be ignored during heating and cooling processes. Furthermore, the diffusion of doping elements as the temperature rises is increasingly becoming a problem. The doped elements should not leave the intended three-dimensional region after the doping process. Otherwise the physical properties of the circuits would fundamentally change. In the best case this leads to a deterioration, in the worst and most probable case to unserviceability of the component. Mainly memories are susceptible to high temperatures due to their high transistor density and their high doping density. On the other hand, there are memories in which 3D technology is being increasingly used to raise the capacity and performance.

The problem in the existing prior art is to create a surface as flat as possible after decontamination of the surface. To some extent this is enabled by grinding processes. Grinding processes are however unable to perfectly planarize the surface. Another working step would be polishing. Here tools with special surfaces which further reduce the metal surface roughness are used. By a combination of grinding and polishing, roughnesses in the nanometer, often even in the subnanometer range, are produced. In most cases so-called CMP methods are used. It is a chemical-mechanical polishing process. Regardless of how long or how precisely grinding is done, a residual roughness which cannot be eliminated always results. This residual roughness upon contact of two surfaces always leads to formation of pores in the nanometer and subnanometer range.

SUMMARY OF THE INVENTION

The object of this invention is therefore to devise a method for careful production of a permanent bond between two solid substrates with a bond force as high as possible at a temperature which is simultaneously as low as possible.

This object is achieved with the features of the independent claim(s). Advantageous developments of the invention are given in the dependent claims. All combinations of at least two of the features given in the specification, the claims and/or the figures also fall within the framework of the invention. At the given value ranges values which lie within the indicated boundaries will also be considered disclosed as boundary values and will be claimed in any combination.

The basic idea of this invention is to apply or create at least on one of the solid substrates a function layer with a second material which reacts with a first material of the other solid substrate especially after contact-making or production of a prebond between the solid substrates, and thus forms an irreversible or permanent bond between the solid substrates. The two solid substrates need not necessarily form a prebond with one another. Simple contact-making without formation of a prebond is also possible. According to the present invention the "reaction" is solid diffusion and/or a phase transformation. Before and/or after formation/application of the function layer on the first and/or second substrate, cleaning of the solid substrates or of the solid substrates generally takes place, especially by a rinsing step. This cleaning should generally ensure that there are no particles on the surfaces which would result in unbonded sites.

The function layer and the second material contained in the function layer create the technical possibility of inducing a reaction (first material with the second material) which increases the bond rate and which strengthens the permanent bond directly on the contact surfaces between the solid substrates after producing the temporary or reversible bond in a controlled manner, especially by deformation of at least one of the contact surfaces (preferably the contact surface formed by the function layer) by the reaction, gaps present due to unevenness of the surfaces/contact surfaces being closed, especially in conjunction with pressing together by applying pressure to the solid substrates against one another. Deformation is an expansion of the volume in general, a phase transformation or plasticization which leads to a change in the shape of the crystallites and/or amorphous regions of the surface.

Solid substrates according to the present invention are those solid substrates whose material is able to react or mix as material with another supplied material to form a mixed material with a higher molar volume, as a result of which growth on the function layer is caused, especially on valleys of the surfaces of the solid substrates which form on gaps. The following combinations of materials are especially advantageous, either due to the possibility of forming mixed crystals, of plastically deforming well, of passing through phase transformations which lead to an increase of volume, or due to any other direct or indirect methods named in the specification for closing the gaps in the bond interface:

Cu—Fe, Cu—Ge, Cu—In, Cu—Li, Cu—Mg, Cu—Mn, Cu—Nb, Cu—Nd, Cu—Ni, Cu—Si, Cu—Sn, Cu—Zn, Cu—Zr, Cu—Ti, Cu—W, Cu—Ti, Cu—Ta, Cu—Au, Cu—Al, Cu—Cu

W—Fe, W—Ge, W—In, W—Li, W—Mg, W—Mn, W—Nb, W—Nd, W—Ni, W—Si, W—Sn, W—Zn, W—Zr, W—Ti, W—Ti, W—Ta, W—Au, W—Al

Ti—Fe, Ti—Ge, Ti—In, Ti—Li, Ti—Mg, Ti—Mn, Ti—Nb, Ti—Nd, Ti—Ni, Ti—Si, Ti—Sn, Ti—Zn, Ti—Zr, Ti—Ta, Ti—Au, Ti—Al

Ta—Fe, Ta—Ge, Ta—In, Ta—Li, Ta—Mg, Ta—Mn, Ta—Nb, Ta—Nd, Ta—Ni, Ta—Si, Ta—Sn, Ta—Zn, Ta—Zr, Ta—Ti, Ta—W, Ta—Ti, Ta—Ta, Ta—Au, Ta—Al

Au—Fe, Au—Ge, Au—In, Au—Li, Au—Mg, Au—Mn, Au—Nb, Au—Nd, Au—Ni, Au—Si, Au—Sn, Au—Zn, Au—Zr, Au—Ti, Au—W, Au—Ti, Au—Ta, Au—Au, Au—Au, Au—Al

Al—Fe, Al—Ge, Al—In, Al—Li, Al—Mg, Al—Mn, Al—Nb, Al—Nd, Al—Ni, Al—Si, Al—Sn, Al—Zn, Al—Zr, Al—Ti, Al—W, Al—Ti, Al—Al, Al—Al, Al—Al

The following mixed forms of semiconductors are also conceivable as solid substrates:

III-V: GaP, GaAs, InP, InSb, InAs, GaSb, GaN, AlN, InN, $Al_xGa_{1-x}As$, $In_xGa_{1-x}N$

IV-IV: SiC, SiGe

III-VI: InAlP nonlinear optics: $LiNbO_3$, $LiTaO_3$, KDP ($KH_2PO_4$)

solar cells: CdS, CdSe, CdTe, $CuInSe_2$, $CuInGaSe_2$, $CuInS_2$, $CuInGaS_2$ conductive oxides: $In_{2-x}SnxO_{3-y}$ Although the aforementioned binary, tertiary and quaternary phase systems generally have extremely low edge solubilities, due to their covalent bonding affinity they behave in a rather brittle manner, occur mostly as single crystals and only very rarely as polycrystals, the properties for metals of the present invention can also occur in semiconductor systems. It should be noted that the surface roughnesses of current semiconductor wafers can be reduced to such a degree that the gaps which are to be closed according to the present invention can only have a volume in the angstrom range. It is a fact that even for poor edge solubility of a multicomponent system components can dissolve in the main component even if only in the ppm range. Therefore, the ideas of the present invention will and should be considered as disclosed even for nonmetallic systems.

It is especially advantageous in the present invention if contact-making of the solid substrates after application of the function layer takes place as near as possible in time, especially within 2 hours, preferably within 30 minutes, even more preferably within 10 minutes, ideally within 5 minutes. This measure minimizes possible unwanted reactions such as oxidation of the function layer or of the surfaces of the solid substrates.

According to the present invention there can be means for inhibiting these reactions of the function layer and/or of the surfaces of the solid substrates before the contact surfaces make contact, especially by passivation of the reaction layer of the solid substrates, preferably by exposure to $N_2$, forming gas or an inert atmosphere or under a vacuum or by amorphization. In this connection treatment with plasma which contains forming gas, especially consists largely of forming gas, has proven especially suitable. Here, forming gas is defined as gases which contain at least 2%, better 4%, ideally 10% or 15% hydrogen. The remaining portion of the mixture consists of an inert gas such as for example nitrogen or argon. Systems with an inert atmosphere or vacuum atmosphere can preferably be implemented as systems in which the transfer of the solid substrates from one process chamber to the next process chamber takes place by means of a solid substrate handling system which can carry out the transfer of the solid substrates completely in a controlled, adjustable atmosphere, especially a vacuum atmosphere. These systems are known to one skilled in the art.

The contact surfaces conventionally show a roughness with a quadratic roughness ($R_q$) of 0.2 nm. This corresponds to peak-to-peak values of the surfaces in the range of 1 nm. These empirical values were determined with atomic force microscopy (AFM).

The reaction of the present invention is suitable for allowing the function layer to grow by 0.1 to 10 nm, especially 0.1 to 1 nm, preferably by 0.1 to 0.3 nm, for a conventional wafer surface of a circular wafer with a diameter of up to 450 mm, especially locally on gaps between the contact surfaces of the solid substrates.

The (additionally applied) function layer is applied by one or more of the following methods:

PECVD,
LPCVD,
vapor deposition,
epitaxy,
MOCVD, and
sputtering.

The invention thus solves the problem of better welding of the surfaces of solid substrates which have been brought into contact with one another by on at least one of the surfaces a solid reaction with another material which is located in the function layer being produced which leads to a volume expansion of the corresponding region near the surface and thus closes the gaps or pores which are present due to surface roughness in the interface (boundary surface between the solid substrates which have been brought into contact). It should be mentioned here that the two solid substrates which are to be welded to one another are already for the most part in contact with one another. At the contact sites a volume expansion onto the solid substrates is of course normally not possible since the material in this direction is subject to obstruction of expansion. Still all methods of the present invention which increase the energy state so dramatically that the material spreads into the pores are explicitly mentioned. Either the material expands by the methods of the present invention directly into the pores (by way of example, but not restrictively, here let the volumetric expansion by mixed crystal formation or a phase transformation be mentioned) or the material cannot expand in one direction due to the methods of the present invention since it is subject to obstruction of expansion, but fills the nearby pores, since based on the increased energy state it deforms plastically. For the sake of completeness it should be mentioned that plastic deformation can take place by dislocations, twinning or diffusion and in a strict physical sense is not accompanied by a volume expansion. There is no longer any explicit differentiation between plasticization and (residual elastic) volume expansion hereinafter. The term volume expansion will stand for a residual enlargement and/or deformation of a surface part.

The second material can be applied either as a layer to at least one of the two substrates (FIG. 2), can penetrate by grain boundary diffusion between the grains of a first especially polycrystalline material into the volume (FIG. 3), can alternate in a layer structure with layers of the first material (FIG. 4) or can be applied to the second solid substrate by mechanical alloying of microparticles and/or nanoparticles (FIG. 5).

This results in higher bond strengths at lower temperatures.

According to one advantageous embodiment of the invention it is provided that formation and/or reinforcement of the permanent bond by diffusion of the second material into the first material takes place especially with formation of a mixed material C.

According to another advantageous embodiment of the invention, it is provided that the formation of the permanent bond takes place at a temperature between room temperature and 200° C., especially between room temperature and 150° C., preferably between room temperature and 100° C., even more preferably between room temperature and 50° C., especially during a maximum 12 days, preferably a maximum 1 day, even more preferably a maximum 1 hour, at best a maximum 15 minutes.

Here it is especially advantageous if the irreversible bond has a bond strength of greater than 1.5 $J/m^2$, especially greater than 2 $J/m^2$, preferably greater than 2.5 $J/m^2$.

The bond strength can be increased especially advantageously in that during solid diffusion and/or phase transformation a mixed material C with a greater molar volume than the molar volume of the second material and of the first material is formed. In this way growth on the second solid substrate or on the function layer is effected, as a result of which gaps between the contact surfaces can be closed by the chemical reaction of the present invention. As a result, the distance between the contact surfaces, therefore the average distance, is reduced, and dead spaces are minimized.

To the extent prior to application/formation of the function layer plasma activation of the surfaces of the solid substrates takes place especially with an activation frequency between 10 and 600 kHz and/or a power density between 0.075 and 0.2 watt/$cm^2$ and/or with application of a pressure between 0.1 and 0.6 mbar, additional effects such as smoothing of the contact surface are effected. Here application of pressure is defined as the pressure of the working atmosphere during plasma activation.

In another advantageous embodiment of the invention it is advantageously provided that the solid diffusion and/or phase transformation is limited to one surface layer (3o) of the first solid substrate (1) with a maximum initial density D less than 1 μm, especially less than 100 nm, preferably less than 10 nm, even more preferably less than 1 nm.

To the extent the solid substrates are pressed together at a pressure between 0.1 MPa and 10 MPa, optimum results can be achieved. Preferably the pressure is between 0.1 and 10 MPa, still more preferably between 0.1 and 1 MPa, most preferably between 0.1 and 0.3 MPa. The pressure must be chosen to be greater, the greater the irregularities and the thinner the layers.

Advantageously according to one embodiment of the invention it is provided that the formation/application of the function layer is carried out in a vacuum. Thus the contamination of the function layer with unwanted materials or compounds can be avoided.

It is especially effective for the method sequence if the function layer is made preferably in an average thickness R between 0.1 nm and 25 nm, more preferably between 0.1 nm and 15 nm, even more preferably between 0.1 nm and 10 nm, most preferably between 0.1 nm and 5 nm.

Other advantages, features and details of the invention will become apparent from the following description of preferred exemplary embodiments and using the drawings.

BRIEF DESCRIPTION OF THE DRAWINGS

FIGS. 5b to 5d show enlargements of the boundary surface between the second solid substrate and the function layer according to FIG. 5a.

The same or equivalent features are identified with the same reference numbers in the figures.

DETAILED DESCRIPTION OF THE INVENTION

The invention describes a method for a volume expansion of regions near the surface (proceeding from an effective contact surface 6 between the solid substrates 1, 2 which are to be bonded), specifically of a first surface layer 3 of the first solid substrate 1 and/or a second surface layer 4 of the second solid substrate 2 and/or a function layer 5 which is provided on a surface layer 3, 4.

Figure 1A:
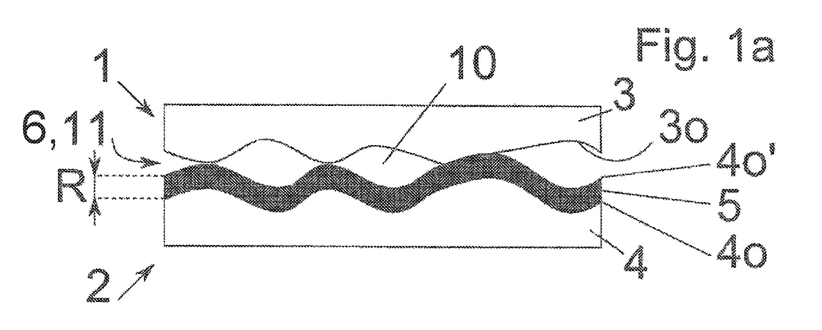
FIG. 1a shows a first and a second solid substrate of the present invention at the instant of the method of the present invention immediately after contact of the first solid substrate is made with the second solid substrate.
Figure 1B:
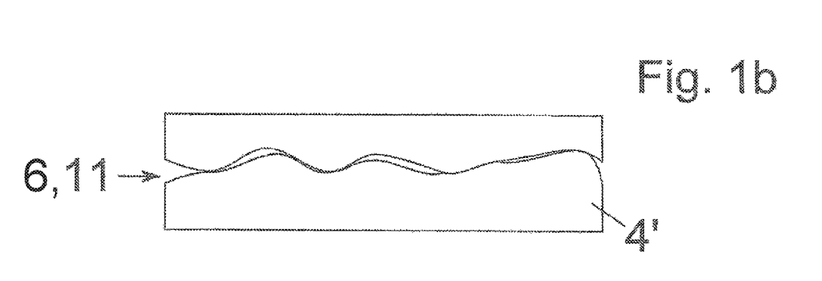
FIG. 1b shows permanently joined solid substrates after carrying out the method of the present invention.

The volume expansion takes place by a solid reaction between the first material A and a second material B such that gaps 10 are closed between the contacted solid substrates 1, 2 along the effective contact surface 6 (interface 11) during an additional application of pressure in a bond process. The gaps 10 immediately after the solid substrates 1, 2 that have made contact according to FIG. 1a are still comparatively large due to their unevenness. In this way the effective contact surface 6 is accordingly small. In FIG. 1b a volume expansion (growth) has been caused by the solid reaction so that the gaps 10 have been distinctly reduced in size, in particular in the volume at least by a factor of 2, preferably at least by a factor of 5, even more preferably at least by a factor of 10. Accordingly the effective contact surface 6 has become larger.

The solid state reaction takes place here between the second material B which is preferably present in the function layer 5 (>50% by volume) and the first material A of one of the solid substrates 1 and/or 2, preferably at least of the first, especially upper solid substrate 1.

The function layer 5 can be produced using various methods which are described below, as a result of which an altered second surface side 4' (since it additionally has the function layer 5) with a new surface 4o' is formed.

According to the present invention it is also conceivable for the two solid substrates 1, 2 to consist of two different materials $A_1$ and $A_2$. If the second material B is chosen such that a volume expansion in a reaction/mixture with the two first materials $A_1$ and $A_2$ takes place, this description can be applied thereto and is covered by the invention. In one preferred case the materials $A_1$, $A_2$ and B are chosen to be single-phase, single-component systems. Alternatively, first materials $A_1$ and $A_2$ are identical, especially materials A and B being chosen from the group of metals.

The surface layers 3 and/or 4 are those volumetric regions under the surfaces 3o, 4o of the substrates 1, 2 in which the solid reaction of the present invention at least largely proceeds. The surface layers 3, 4 have especially an average thickness D smaller than 1 m, preferably smaller than 100 nm, even more preferably smaller than 10 nm, most preferably smaller than 1 nm. If the second material B is made as polycrystalline material, the average thickness D of the surface layers 3, 4 is especially a maximum 50 times as large as the average grain diameter of the second material B (especially of the single crystals of second material B), more preferably a maximum 20 times as large, even more preferably a maximum 10 times as large, most preferably a maximum 5 times as large, most preferably of all a maximum twice as large. FIGS. 1a and 1b are thus shown highly enlarged.

FIG. 1a shows the state of contact-making of the surfaces 3o, 4o before the solid reaction between the two materials A and B, while FIG. 1b shows the surface layers 3, 4 after completed volume expansion and the successful bonding process. The figures show the change of the volume and the gap closure which occurs with it along the interface 11 or along the effective contact surface 6 which becomes larger due to the gap closure. By enlarging the effective contact surface 6 and by distinctly reducing the average distance between the surfaces 3o, 4o, the bond force is greatly increased. Even more ideally the holes are completely closed so that at least later the bond interface can no longer be recognized.

The second material B of the function layer is at least partially consumed by the solid reaction in the surface layer 3 and/or 4. The average thickness R of the function layer 5 is dependent on the most varied parameters (temperature, choice of materials A and B, bond pressure, time progression, diffusion rates). The materials A and B can be metals, plastics, ceramics or semiconductors, metals being preferred. The solid substrates 1, 2 can be made especially as wafers.

The different embodiments of the present invention are now detailed. Here the materials A and B are selected as single-phase, single-component materials. The material A and or the material B each consist preferably of a single or uniform material. In the illustrated embodiments the second material B is applied only to the second solid substrate 2.

One embodiment of the present invention consists in expanding the volume by dissolving the second material B in the first material A. By way of example, for this embodiment of the present invention the copper-tin system has been named. The substance for the first material A is the metal copper and the second material B is the metal tin.

The expansion of the copper which contributes to closing of the gaps 10 in the interface 11 takes place by the formation of a copper mixed crystal C.

Figure 2A:
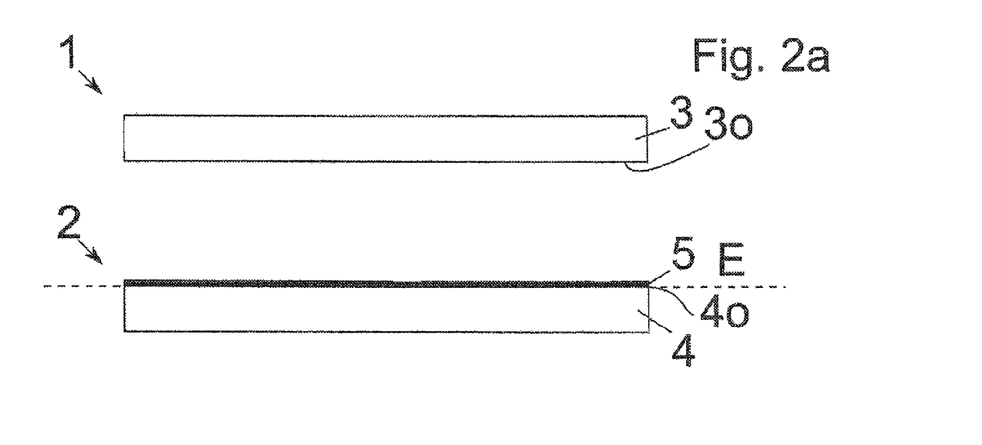
FIG. 2a shows one step of the method of the present invention for formation/application of one function layer.

A mixed crystal C is a crystalline phase which consists of at least two different materials, here the materials A and B which are completely miscible with one another within a concentration range. According to Cu—Sn phase diagrams, copper at room temperature has a solubility for tin. The solubility increases as temperature rises and has a peak at roughly 850K. Conversely tin has a negligibly low solubility for copper up to the melting point. Based on the relationship between the volume and the concentration of each mixed crystal (Vegard's rule), in the simplest embodiment tin as the second material B is deposited on the surface layer 4 of the second solid substrate 2 (at least surface layer 4 of copper as the first material A) (FIG. 2a). The method parameters are chosen such that the second material B (tin) at this instant does not join the first material A (copper). The amount of tin is such that in a diffusion of the tin into the copper which takes place later (FIG. 2c) an intermetallic phase preferably never forms. In other words: The surface layer 4 is not saturated with tin at any point such that intermetallic phases can form. For the binary phase system Cu—Sn according to the phase diagram at room temperature a molar concentration for Sn in Cu of roughly 0.01 (corresponds to roughly 14% by weight Sn) may not be exceeded. Thus the formation of the $Cu_3Sn$ phase is suppressed since the solubility limit of copper for the Sn has not yet been exceeded. For rising temperature the solubility of Sn in Cu becomes accordingly greater.

The volume of the copper mixed crystal C very probably changes however by the absorption of the second material B (tin) into the first material A (copper). Since tin has a larger atomic radius than copper, the volume of the copper mixed crystal C rises with increasing tin content (FIG. 2d). The start of the diffusion process of tin into copper is controlled preferably based on process parameters, especially by a temperature increase since the diffusion constants depend explicitly on the temperature.

In the embodiment presented here the permanent bonding takes place below 200° C. The temperature at which a noticeable diffusion of the tin into the copper begins, with the other process parameters which have been chosen in the present invention, is between room temperature (RT) and 200° C., more preferably between RT and 150° C., even more preferably between RT and 100° C., most preferably between RT and 50° C. For one skilled in this art it is clear that any parameter which can control the desired diffusion can be used to achieve the desired effect.

Copper accepts tin by the controlled use of diffusion, thus increases its volume and can thus close the gaps 10 in the interface 11. For metals the high plasticity additionally promotes the process of closing of the gaps 10.

According to the present invention the intention is moreover to prevent the solubility boundary of the first material A (copper) for the second material B (tin) from being exceeded so that the separation of intermetallic phases is prevented as extensively as possible, preferably completely. To the extent materials A and B are chosen which are completely miscible in the solid state, the solubility boundary of the present invention can remain ignored.

Figures 2B, 2C:
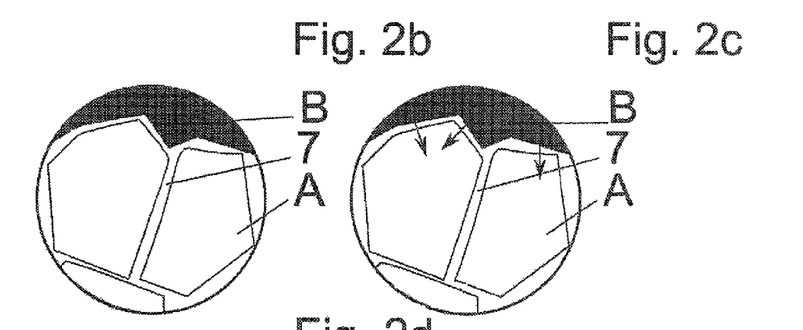
FIGS. 2b to 2d show enlargements of the boundary surface between the second solid substrate and the function layer according to FIG. 2a, FIG. 3 shows one alternative step of the method of the present invention for formation/application of one function layer.
Figure 2D:
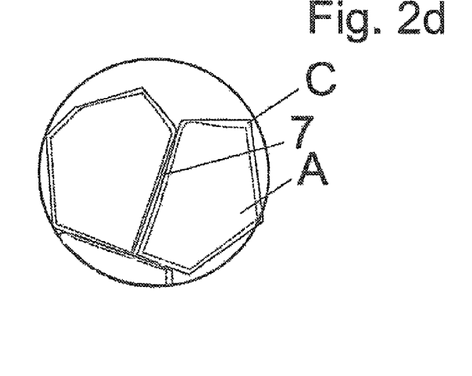

The deposition of the second material B (tin) on the first material A (copper) is carried out in the present invention such that the solubility boundary of the copper for tin at the corresponding temperature is exceeded at as few sites as possible, more preferably at no site in the surface layer 4 (see FIG. 2b). The components (single crystals or multicrystals) of the first material A are shown schematically.

The growth of the first material A in the form of the mixed material C is shown schematically in FIG. 2d. Intermediate spaces 7 (if present) between components of the first material A become smaller, so that the components try to expand in the direction of the contact surface 6. In doing so the mixed material C expands primarily in the region of the gaps 10 due to the pressure of the opposing solid substrate 1, which pressure is prevailing on the active contact surface 6.

In order to largely prevent the formation of intermetallic phases, according to another version it is provided that the second material B (tin) as a function layer 5 is deposited not only on the surface 4o of the first material A (copper) (FIG. 2), before the actual dissolution process starts, but to be introduced into the surface layer 4 within the layer thickness d (FIG. 3) without allowing the tin to pass into solution with the copper.

Figure 3A:
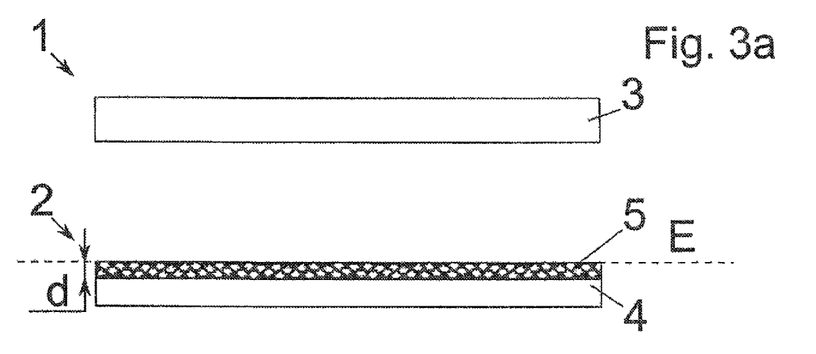
Figures 3B, 3C:
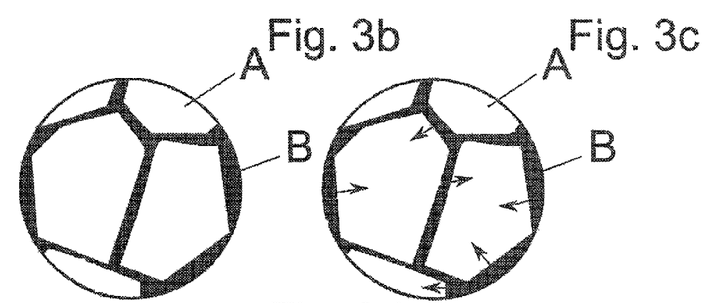
FIGS. 3b to 3d show enlargements of the boundary surface between the second solid substrate and the function layer according to FIG. 3a, FIG. 4 shows one alternative step of the method of the present invention for formation/application of one function layer.
Figure 3D:
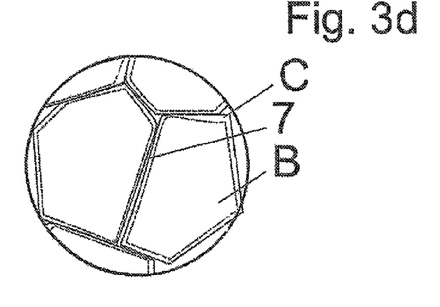
Figure 4A:
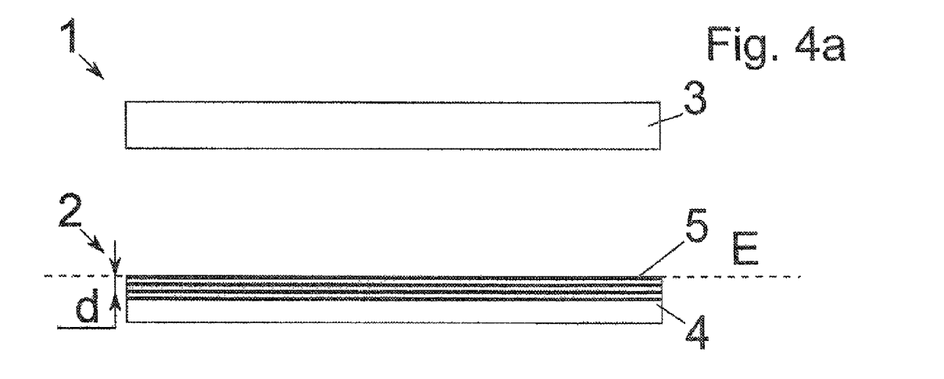
Figure 4B:
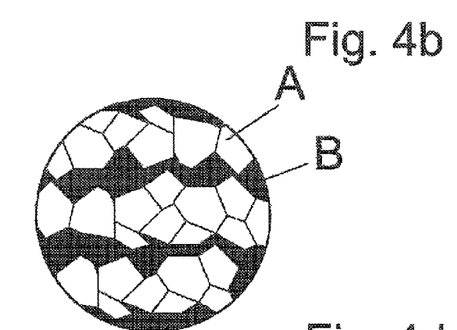
FIGS. 4b to 4d show enlargements of the boundary surface between the second solid substrate and the function layer according to FIG. 4a, FIG. 5 shows one alternative step of the method of the present invention for formation/application of one function layer.
Figure 4C:
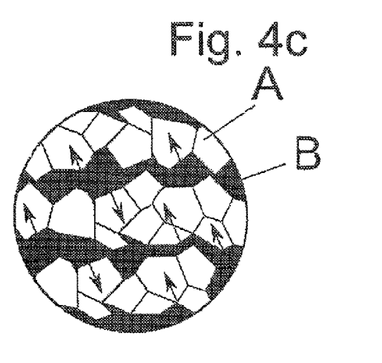
Figure 4D:
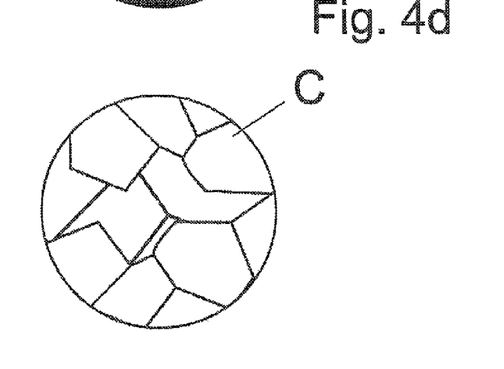
Figure 5A:
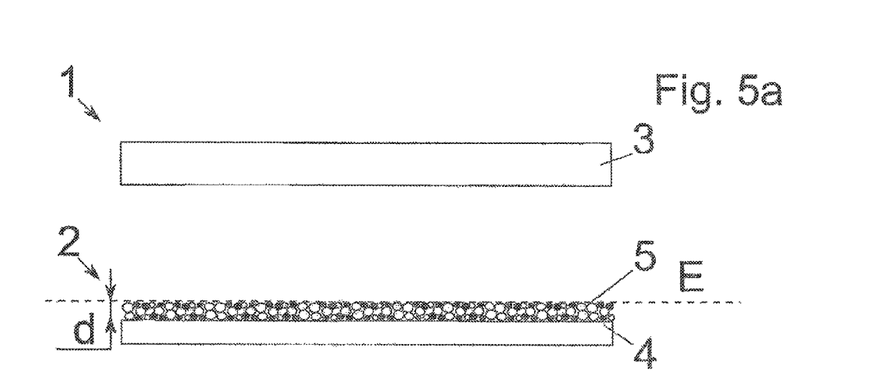
Figure 5B:
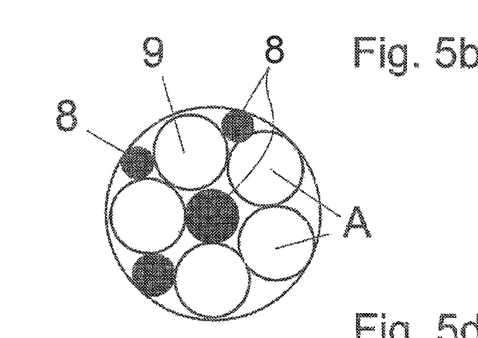
Figure 5C:
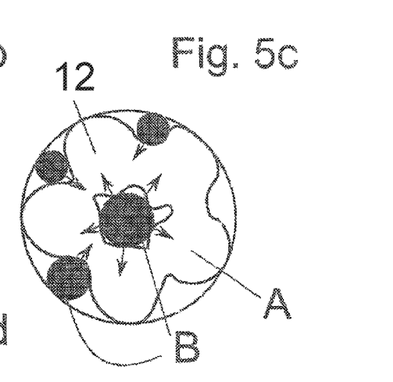
Figure 5D:
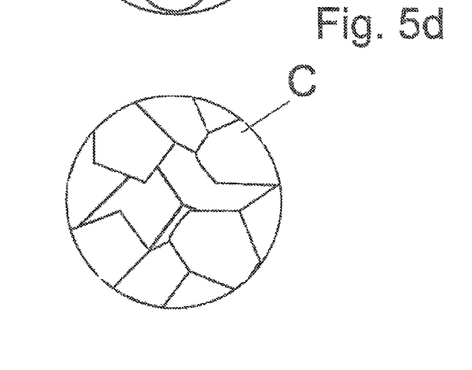

For this purpose the second material B (tin) will travel especially via grain boundary diffusion processes to greater depths of the polycrystalline first material A (copper), preferably will not yet pass into the volume of the grains, at most penetrate on the outer edge of the grains slightly into the depth and only in a decisive bonding process actually penetrate into the volume in order to cause the increase of the volume (FIG. 3). The polycrystalline microstructure of the first material A is polycrystalline, therefore consists of individual grains which are separated from one another by intermediate spaces 7 (here: grain boundaries). The intermediate spaces 7 for a polycrystalline microstructure are two-dimensional lattice structural defects into which atoms of different species can penetrate. Preferably the microstructure of at least one of the solid substrates 1, 2 which are to be bonded is produced such that the second material B (tin) is located not only on the surface 4o, but also in the surface layer 4 without dissolving in the copper. Thus the function layer 5 in this embodiment is at least partially identical to the surface layer 4.

One version of the present invention therefore consists in using the difference between grain boundary diffusion and volumetric diffusion to convey the tin into the volumetric depth of the copper layer without obtaining concentration elevations in the copper grains (see especially FIG. 3). The process parameters here are chosen such that the grain boundary diffusion takes place before a volumetric diffusion since for the diffusing species—in the exemplary embodiment tin—it is much easier to advance into the extensive grain boundaries than through the narrow lattice of the bulk (of the copper grains). Here the consideration of the diffusion coefficient is decisive. The diffusion coefficient for the grain boundary diffusion for an intended temperature is larger than the diffusion coefficient for the corresponding volumetric diffusion. The grain boundary surface to grain volume ratio must also be considered here since at a higher ratio per unit of volume there are accordingly more grain boundaries. Especially preferably the aggregate state of the phase which is moving along the grain boundaries is liquid. Therefore according to the present invention materials are recommended which have a very low melting point. The diffusion rate of the liquid phase along the grain boundary is accordingly high.

Thus the second material B here diffuses into the first material A not only on the boundary surface between the function layer 5 and the surface 4o before application of the function layer 5, due to the penetration of the surface layer 4 from more or less all sides of each component (copper grain) of the first material A.

Another version consists in depositing a layer structure (FIG. 4). The components copper and tin are deposited in layers, preferably in alternation material A and B by conventional deposition methods. In this way there is an "intermediate solution" to the pure "surface solution" according to FIG. 2 and the "mixed solution" according to FIG. 3 in which there are several boundary surfaces for diffusion of the second material B into the first material A.

According to another embodiment of the invention it is provided that the first material A (copper) and the second material B (tin) as microparticles and/or nanoparticles 8, 9 will be deposited from a solution on the surface 4o, therefore a mechanical alloy will be applied to the second solid substrate 2 (FIG. 5). For spherical particles at the known density of the copper and of the tin and the known average spherical radii of the copper and tin particles the required mixing ratio for the copper-tin mixed crystal can be exactly computed. Formulas which have been adapted accordingly can be used for particles with a different shape.

In the bonding process in this embodiment preferably sinter bridges arise which weld the microparticles and/or nanoparticles 9 to one another into a sinter matrix 12. At the same time diffusion of the second material B into the sinter matrix 12 takes place. Since the microparticles and/or nanoparticles 8 of the second material B are present statistically uniformly distributed through the mechanical alloy in the sinter matrix 12 of the first material A, an optimum uniform distribution of the second material B over a volumetric region which can be sharply delineated is possible. The materials A and B are chosen according to the present invention such that the volume of the newly formed mixed crystal C (via the sinter process) is larger than the volume of the mechanical alloy prior to the bonding process.

It must be considered here that mechanical alloys due to the microparticles and/or nanoparticles 8, 9 have a generally lower density than bulk materials since between the microparticles and/or nanoparticles 8, 9 there is a large amount of empty space which is closed only after by the sinter process. In the most optimum case the empty space is completely broken down. Preferably the structure after the bonding process is again a polycrystalline structure with a mixed crystal.

According to the present invention there is also a preferred version in which copper and tin are directly deposited with the intended concentration onto the second solid substrate by PVD and/or CVD processes. In this way the mixed material C (mixed crystal) is directly produced. An overly large tin concentration would lead to intermetallic phases.

In another embodiment the increase of the volume is accomplished by the formation of a completely new phase, therefore a phase transformation instead of diffusion (also conceivable in combination according to the present invention). The reaction of the second material B with the first material A leads to any compound AxBy whose molar volume is greater than the sum of the two molar volumes of the materials A and B. The phase transformation will proceed in a controlled manner by the choice of corresponding process parameters. Therefore the deposited second material B should only then preferably react only with the first material A if this is desirable, therefore during the bond process. The increase of the volume is therefore caused by a phase transformation.

In one specific embodiment of the phase transformation the increase of volume is produced by a martensitic transformation. A martensitic transformation is a diffusion-less phase transformation which takes place by a shear mechanism process of the lattice. The shear mechanism process takes place only by a very rapid temperature drop. Another advantage of a martensite consists in the often extremely high dislocation densities which are caused by the shear processes of martensite formation. In the bond process the pores would be closed by means of the volume expansion during the martensitic transformation, but at the same time the structure would be extremely consolidated, i.e. its dislocation density would rise. The dislocation density can possibly be used in some martensites as an aid for a later recrystallization process.

In another embodiment the increase of the volume during the bond process in the regions near the surface is caused by the spinodal decomposition of an alloy. A spinodal decomposition is a spontaneous separation of a homogeneous structure into at least two phases by a critical parameter being exceeded, preferably the critical temperature. The homogeneous structure was produced by a cooling process of a multicomponent system whose concentration is within the spinodals. It is known to one skilled in the art which alloys can decompose spinodally, and how these alloys have to be produced and heat-treated. In particular alloys with spinodal decomposition whose decomposition process leads to an expansion of volume are chosen.

REFERENCE NUMBER LIST

1 first solid substrate
2 second solid substrate
3 first surface layer
3$o$ surface
4, 4' second surface layer
4$o$, 4$o'$ surface
5, 5' function layer
6 effective contact surface
7 intermediate spaces
8 microparticles and/or nanoparticles
9 microparticles and/or nanoparticles
10 gap
11 interface
12 sinter matrix
A first material
B second material
C mixed material

The invention claimed is:

1. A method for bonding of a first solid substrate to a second solid substrate, the method comprising:
   forming or applying a function layer on the second solid substrate, the function layer containing a second material,
   contacting the first solid substrate with the function layer on the second solid substrate, the first solid substrate containing a first material, and
   pressing together the first and second solid substrates to form a permanent bond between the first solid substrate and the second solid substrate and at least partially reinforce the permanent bond by solid diffusion of the second material contained in the function layer into the first material contained in the first solid substrate such that the function layer is consumed by the first solid substrate, the second solid substrate, or a combination thereof,
   wherein the function layer has an average thickness in a range between 0.1 nm and 25 nm, before formation of the permanent bond between the first solid substrate and the second solid substrate,
   wherein the solid diffusion is induced on respective contact surfaces of the first and second solid substrates at an interface between the first and second solid substrates, and
   wherein gaps between the respective contact surfaces at the interface are closed by volume expansion of at least one of the respective contact surfaces caused by the solid diffusion and the step of pressing together the first and second solid substrates.

2. The method as claimed in claim 1, wherein the formation of the permanent bond takes place at a temperature between room temperature and 500° C.

3. The method as claimed in claim 2, wherein said temperature is between room temperature and 200° C.

4. The method as claimed in claim 2, wherein said temperature is between room temperature and 150° C.

5. The method as claimed in claim 2, wherein said temperature is between room temperature and 100° C.

6. The method as claimed in claim 2, wherein said temperature is between room temperature and 50° C.

7. The method as claimed in claim 2, wherein the formation of the permanent bond takes place during a maximum 12 days.

8. The method as claimed in claim 2, wherein the formation of the permanent bond takes place during a maximum 1 day.

9. The method as claimed in claim 2, wherein the formation of the permanent bond takes place during a maximum 1 hour.

10. The method as claimed in claim 2, wherein the formation of the permanent bond takes place during a maximum 15 minutes.

11. The method as claimed in claim 1, wherein the permanent bond has a bond strength of greater than 1.5 J/m$^2$.

12. The method as claimed in claim 11, wherein the bond strength is greater than 2 J/m$^2$.

13. The method as claimed in claim 11, wherein the bond strength is greater than 2.5 J/m$^2$.

14. The method as claimed in claim 1, wherein, during the solid diffusion, a mixed material is formed having a molar volume that is greater than a molar volume of the second material and of the first material.

15. The method as claimed in claim 1, further comprising plasma activating surfaces of the solid substrates prior to and/or after the application/formation of the function layer.

16. The method as claimed in claim 1, wherein the solid diffusion is limited to a first surface layer of the first solid substrate having a maximum initial thickness less than 1 μm.

17. The method as claimed in claim 16, wherein the maximum initial thickness is smaller than 100 nm.

18. The method as claimed in claim 16, wherein the maximum initial thickness is smaller than 10 nm.

19. The method as claimed in claim 16, wherein the maximum initial thickness is smaller than 1 nm.

20. The method as claimed in claim 1, wherein the step of pressing together the first and second solid substrates takes place at a pressure between 0.1 and 10 MPa.

21. The method as claimed in claim 1, wherein during forming of the permanent bond, a solubility boundary of the first material contained in the first solid substrate for the second material contained in the function layer is exceeded only slightly.

22. The method as claimed in claim 21, wherein, during formation of the permanent bond, a solubility boundary of the first material contained in the first solid substrate for the second material contained in the function layer is exceeded at no site of solid diffusion.

23. The method as claimed in claim 1, wherein the solid diffusion takes place at least predominantly as grain boundary diffusion.

24. The method as claimed in claim 1, wherein the second solid substrate contains the first material, and wherein the the function layer is consumer by the combination of the first solid substrate and the second solid substrate.

25. The method as claimed in claim 1, wherein the first material is a first metal and the second material is a second metal.

26. A method for bonding of a first solid substrate to a second solid substrate, the method comprising:

forming or applying a function layer on the second solid substrate, the function layer containing a second material, contacting the first solid substrate with the function layer on the second solid substrate, the first solid substrate containing a first material, and pressing together the first and second solid substrates to form a permanent bond between the first solid substrate and the second solid substrate and at least partially reinforce the permanent bond by phase transformation of the first material contained in the first solid substrate with the second material contained in the function layer such that the function layer is consumed by the first solid substrate, the second solid substrate, or a combination thereof, wherein the function layer has an average thickness in a range between 0.1 nm and 25 nm, before formation of the permanent bond between the first solid substrate and the second solid substrate, wherein the phase transformation is induced on respective contact surfaces of the first and second solid substrates at an interface between the first and second solid substrates, and wherein gaps between the respective contact surfaces at the interface are closed by volume expansion of at least one of the respective contact surfaces caused by the phase transformation and the step of pressing together the first and second solid substrates.

\* \* \* \* \*